(12) United States Patent
Wang et al.

(10) Patent No.: US 11,328,148 B2
(45) Date of Patent: May 10, 2022

(54) TOUCH PANEL AND FINGERPRINT RECOGNITION METHOD AND MANUFACTURING METHOD THEREOF, AND DISPLAY DEVICE

(71) Applicant: BOE TECHNOLOGY GROUP CO., LTD., Beijing (CN)

(72) Inventors: Pengpeng Wang, Beijing (CN); Xue Dong, Beijing (CN); Haisheng Wang, Beijing (CN); Xiaoliang Ding, Beijing (CN); Chihjen Cheng, Beijing (CN); Yanling Han, Beijing (CN); Wei Liu, Beijing (CN); Xueyou Cao, Beijing (CN); Rui Xu, Beijing (CN); Yuzhen Guo, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 628 days.

(21) Appl. No.: 16/304,177

(22) PCT Filed: Jan. 30, 2018

(86) PCT No.: PCT/CN2018/074558
§ 371 (c)(1),
(2) Date: Nov. 23, 2018

(87) PCT Pub. No.: WO2018/218981
PCT Pub. Date: Dec. 6, 2018

(65) Prior Publication Data
US 2021/0224500 A1 Jul. 22, 2021

(30) Foreign Application Priority Data

Jun. 2, 2017 (CN) .......................... 201710408894.1

(51) Int. Cl.
| | | |
|---|---|---|
| G06K 9/00 | (2006.01) |
| G06F 3/044 | (2006.01) |
| G06F 3/041 | (2006.01) |
| H01L 27/32 | (2006.01) |

(52) U.S. Cl.
CPC ......... *G06K 9/0002* (2013.01); *G06F 3/0412* (2013.01); *G06F 3/0445* (2019.05);
(Continued)

(58) Field of Classification Search
None
See application file for complete search history.

(56) References Cited

U.S. PATENT DOCUMENTS 9,984,272 B2 5/2018 Yang et al.
2012/0182253 A1 7/2012 Brosnan
(Continued)

FOREIGN PATENT DOCUMENTS

CN 203838717 U 9/2014
CN 104282265 A 1/2015
(Continued)

OTHER PUBLICATIONS

International Search Report dated May 4, 2018 issued in corresponding International Application No. PCT/CN2018/074558.
(Continued)

*Primary Examiner* — Nicholas J Lee
(74) *Attorney, Agent, or Firm* — Nath, Goldberg & Meyer; Joshua B. Goldberg

(57) ABSTRACT

The present disclosure provides a touch panel, a fingerprint recognition method thereof, a method for manufacturing a touch panel and a display device. The touch panel includes multiple driving electrode groups and multiple, sensing electrodes which are intersected with and insulated from each other, each of the driving electrode groups comprises a plurality of driving electrodes, each driving electrodes is
(Continued)

coupled to a scanning line, and the method includes: a first scanning step of performing a first scanning on each of the driving electrode groups by using scanning lines to detect a sensing signal generated by a sensing electrode being touched; a determining step of determining a driving electrode group being touched according to the detected sensing signal; a second scanning step of sequentially performing a second scanning on the driving electrodes in the determined driving electrode group being touched to obtain a valley or a ridge of a fingerprint.

5 Claims, 3 Drawing Sheets

(52) U.S. Cl.
CPC .......... *G06F 3/0446* (2019.05); *H01L 27/323* (2013.01); *G06F 2203/04103* (2013.01)

(56) References Cited

U.S. PATENT DOCUMENTS

| | | | | |
|---|---|---|---|---|
| 2014/0327889 | A1* | 11/2014 | Yamazaki | G03F 7/092 355/27 |
| 2015/0002755 | A1* | 1/2015 | Tang | G06F 3/041 349/12 |
| 2015/0042598 | A1* | 2/2015 | Chae | G06F 3/0446 345/174 |
| 2018/0190721 | A1* | 7/2018 | Liu | G06F 3/0445 |
| 2019/0012518 | A1 | 1/2019 | Yang | |

FOREIGN PATENT DOCUMENTS

| | | | | |
|---|---|---|---|---|
| CN | 105426025 | A | | 3/2016 |
| CN | 105528592 | A | | 4/2016 |
| CN | 105529409 | A | | 4/2016 |
| CN | 106250889 | A | | 12/2016 |
| CN | 106292045 | A | | 1/2017 |
| CN | 106295461 | A | | 1/2017 |
| CN | 106557191 | A | | 4/2017 |
| CN | 106648255 | A | | 5/2017 |
| CN | 106648257 | A | | 5/2017 |
| CN | 106775109 | A | | 5/2017 |
| CN | 107092901 | A | | 8/2017 |
| WO | WO-2016033931 | A | * 3/2016 | ......... H01L 51/5256 |

OTHER PUBLICATIONS

Office Action dated Apr. 17, 2019 issued in corresponding Chinese Application No. 201710408894.1.

* cited by examiner

TOUCH PANEL AND FINGERPRINT RECOGNITION METHOD AND MANUFACTURING METHOD THEREOF, AND DISPLAY DEVICE

CROSS-REFERENCE TO RELATED APPLICATIONS

This is a National Phase Application filed under 35 U.S.C. 371 as a national stage of PCT/CN2018/074558, filed Jan. 30, 2018, an application claiming the priority of Chinese Patent Application No. 201710408894.1, filed on Jun. 2, 2017 in the China Patent Office, the entire disclosure of which is hereby incorporated by reference.

TECHNOLOGY

The present disclosure relates to the field of touch display technology, and in particular, to a touch panel and a fingerprint recognition method thereof, a method for manufacturing a fingerprint recognition touch panel, a touch panel, and a display device.

BACKGROUND

Existing out-cell touch display products generally have one or more layers of films or a glass substrate bonded to a light emitting surface of an OLED display panel to form a touch panel. In order to prevent the touch panel from being scratched, it is generally required to add a protective layer at the outside of the touch panel, which increases a thickness of the touch display product.

SUMMARY

The present disclosure provides a fingerprint recognition method for a touch panel, wherein the touch panel comprises a plurality of driving electrode groups and a plurality of sensing electrodes which are intersected with and insulated from each other, each of the driving electrode groups comprises a plurality of driving electrodes, and each of the driving electrodes is coupled to a scanning line, the method comprises:

a first scanning step of performing a first scanning on each of the driving electrode groups by using scanning lines to detect a sensing signal generated by a sensing electrode being touched;

a determining step of determining a driving electrode group being touched according to the detected sensing signal; and a second scanning step of sequentially performing a second scanning on the driving electrodes in the determined driving electrode group being touched to obtain a valley or a ridge of a fingerprint.

In some implementations, the second scanning step further comprises:

a step of performing the second scanning on each driving electrode in the determined driving electrode group being touched to obtain the valley or the ridge of the fingerprint.

In some implementations, the determining step further comprises:

a step of determining a driving electrode being touched in the determined driving electrode group being touched; and the second scanning step further comprises:

a step of performing the second scanning on the determined driving electrode being touched to obtain the valley or the ridge of the fingerprint.

In some implementations, the sensing signal is a superimposed signal generated by mutual capacitances between the respective driving electrodes in the driving electrode group being touched and the sensing electrode.

In some implementations, the first scanning step further comprises:

a step of applying a same driving signal to each of driving electrodes in a same driving electrode group by the scanning lines.

In some implementations, each of the driving electrode groups comprises three driving electrodes.

The present disclosure further provides a method for manufacturing a fingerprint recognition touch panel, comprising steps of:

forming an organic light emitting device on a base substrate;

forming a plurality of driving electrode groups on a light emitting surface of the organic light emitting device by using a nanoimprinting method, each driving electrode group comprising a plurality of driving electrodes parallel to and spaced apart from each other;

forming an insulating layer on the driving electrode groups; and forming a plurality of sensing electrodes on the insulating layer by using a nanoimprinting method, the driving electrode groups being intersected with the sensing electrodes.

In some implementations, the step of forming the plurality of driving electrode groups on the light emitting surface of the organic light emitting device by using the nanoimprinting method comprises steps of:

forming a photocurable adhesive layer on the light emitting surface of the organic light emitting device;

imprinting on the photocurable adhesive layer by a nanoimprinting method to form a groove pattern corresponding to the driving electrode groups; and forming the driving electrode groups in the groove pattern.

In some implementations, the step of forming the organic light emitting device on the base substrate further comprises steps of:

forming a pixel circuit layer on the base substrate;

forming a light emitting layer on the pixel circuit layer; and forming a first water blocking layer, a planarization layer and a second water blocking layer on the light emitting layer in turn, and wherein the step of forming the plurality of driving electrode groups on the light emitting surface of the organic light emitting device by using the nanoimprinting method further comprises a step of:

forming the plurality of driving electrode groups on the second water blocking layer.

In some implementations, the touch panel comprises a plurality of scanning lines configured to apply a driving signal to each of the driving electrodes, and the manufacturing method further comprising steps of:

while forming the driving electrode groups on the light emitting surface of the organic light emitting device by using the nanoimprinting method, forming first leads corresponding to the driving electrodes on the light emitting surface of the organic light emitting device by using a nanoimprinting method, wherein the first leads couple the scanning lines to the driving electrodes respectively.

In some implementations, a width of the sensing electrode ranges from 10 nm to 1 μm, and a pitch of two adjacent sensing electrodes ranges from 10 nm to 1 μm.

In some implementations, the base substrate comprises a flexible material.

The present disclosure further provides a touch panel comprising: a plurality of driving electrode groups and a plurality of sensing electrodes which are intersected with and insulated from each other, each of the driving electrode groups comprises a plurality of driving electrodes, each of the driving electrodes is coupled to a scanning line, and the touch panel further comprises:

a first scanning device configured to perform a first scanning on each of the driving electrode groups by using scanning lines to detect a sensing signal generated by a sensing electrode being touched;

a determining device configured to determine a driving electrode group being touched according to the detected sensing signal; and a second scanning device configured to sequentially perform a second scanning on the driving electrodes in the determined driving electrode group being touched to obtain a valley or a ridge of a fingerprint.

In some implementations, the determining device further configured to determine a driving electrode being touched in the driving electrode group being touched.

In some implementations, the sensing signal is a superimposed signal generated by mutual capacitances between the respective driving electrodes in the driving electrode group being touched and the sensing electrode.

The present disclosure provides a display device comprising the above touch panel.

DETAILED DESCRIPTION

In order to enable those skilled in the art to better understand the technical solutions of the present disclosure, the present disclosure will be further described in detail below in conjunction with the accompanying drawings and specific embodiments.

For a flexible display panel with touch fingerprint recognition function, the related manufacturing process cannot produce high-precision fingerprint sensor patterns. Because the fingerprint recognition requires high detection accuracy, very large number of capacitive sensors are required, the number of leads is increased, and the time for scanning and recognizing the fingerprint is increased in turn.

Figure 1:
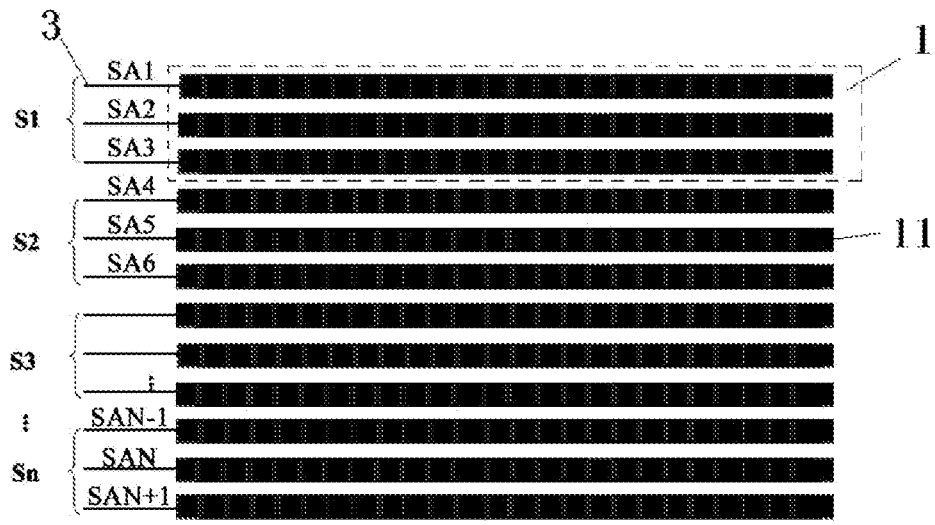
FIG. 1 and FIG. 2 are schematic structural diagrams of a touch panel according to an embodiment of the present disclosure.
Figure 2:
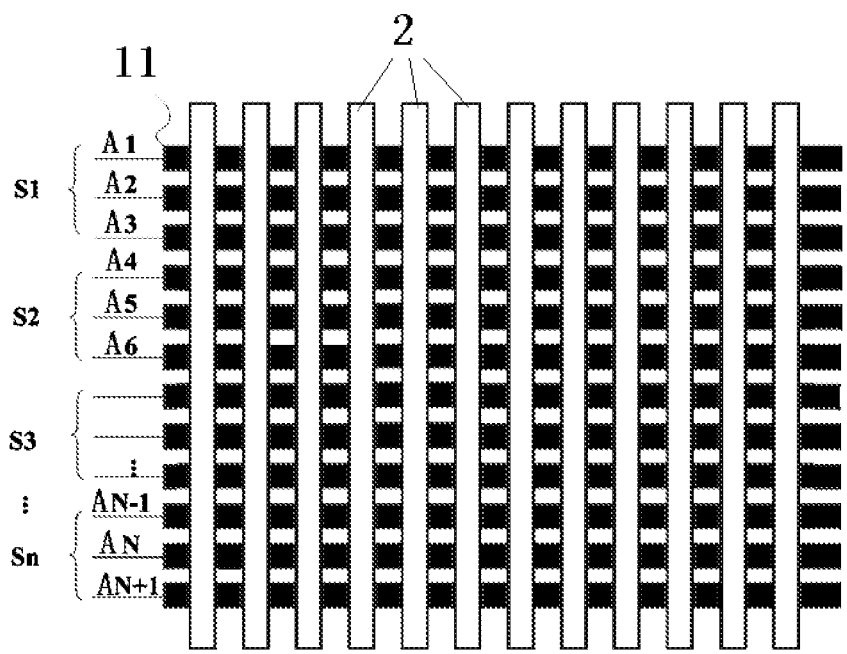
Figure 3:
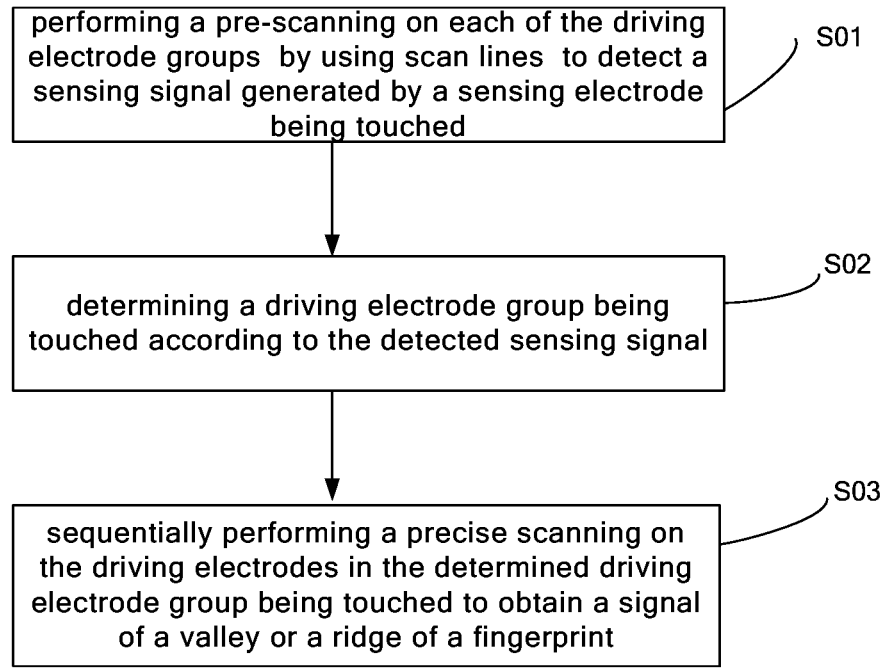
FIG. 3 illustrating a flowchart of a fingerprint recognition method of a touch panel according to an embodiment of the present disclosure.

An embodiment of the present disclosure provides a fingerprint recognition method for a touch panel. As shown in FIG. 1 and FIG. 2, the touch panel includes plural driving electrode groups 1 and sensing electrodes 2 which are intersected with and insulated from each other, each of the driving electrode groups 1 includes a plurality of driving electrodes 11, and each of the driving electrodes 11 is coupled to a scanning line 3. As shown in FIG. 3, the fingerprint recognition method for the touch panel in the present embodiment includes:

a pre-scanning step S01 of performing a pre-scanning on each of the driving electrode groups 1 by using scanning lines 3 to detect a sensing signal generated by a sensing electrode 2 being touched;

a determining step S02 of determining, by a chip, a driving electrode group 1 being touched according to the detected sensing signal;

a precise scanning step S03 of sequentially performing, by the chip, a precise scanning on the driving electrodes 11 in the determined driving electrode group 1 being touched to obtain a signal of a valley or a ridge of a fingerprint.

The precise scanning step further includes a step of performing the precise scanning on each driving electrode 11 in the determined driving electrode group 1 being touched according to the driving electrode group being touched determined in the determining step, to obtain the signal of the valley or the ridge of the fingerprint. Further, optionally, the determining step further includes a step of determining a driving electrode 11 being touched in the determined driving electrode group 1 being touched; and the precise scanning step further includes a step of performing the precise scanning on each of the determined driving electrodes being touched to obtain the signal of the valley or the ridge of the fingerprint.

In the fingerprint recognition method of the present embodiment, when the fingerprint is detected, a touch scanning is performed first at the pre-scanning step, and after the touch scanning is performed for one cycle, a position of a row in which the driving electrode 11 touched by the finger is located is determined at the determining step, then the precise scanning step for the valley and the ridge of the fingerprint is further performed on the row in which the driving electrode 11 touched by the finger is located. This can save the fingerprint scanning time and improve the fingerprint detection speed. It should be noted that the pre-scanning step can fully implement a touch function. Therefore, the present embodiment can implement both of the touch function and the fingerprint recognition function, that is, in a normal touch stage, only the sequence of the pre-scanning step is required, and upon entering the fingerprint scanning stage, the precise scanning step is performed subsequently to achieve accurate fingerprint recognition.

An embodiment of the present disclosure provides a fingerprint recognition method for a touch panel. The touch panel has a structure similar to that of the touch panel of the above embodiment. Referring to FIG. 1 and FIG. 2, the touch panel includes a plurality of driving electrode groups 1 and a plurality of sensing electrodes 2 which are intersected with and insulated from each other, each of the driving electrode groups 1 includes three driving electrodes, each of which is respectively coupled to a scanning line 3. Specifically, referring to FIG. 1, the three driving electrodes 11 enclosed by the dashed line belong to a same driving electrode group 1, which is referred to as a driving electrode group S1. FIG. 1 also shows other driving electrode groups S2, S3 . . . Sn, each of which includes three driving electrodes 11.

Figure 4:
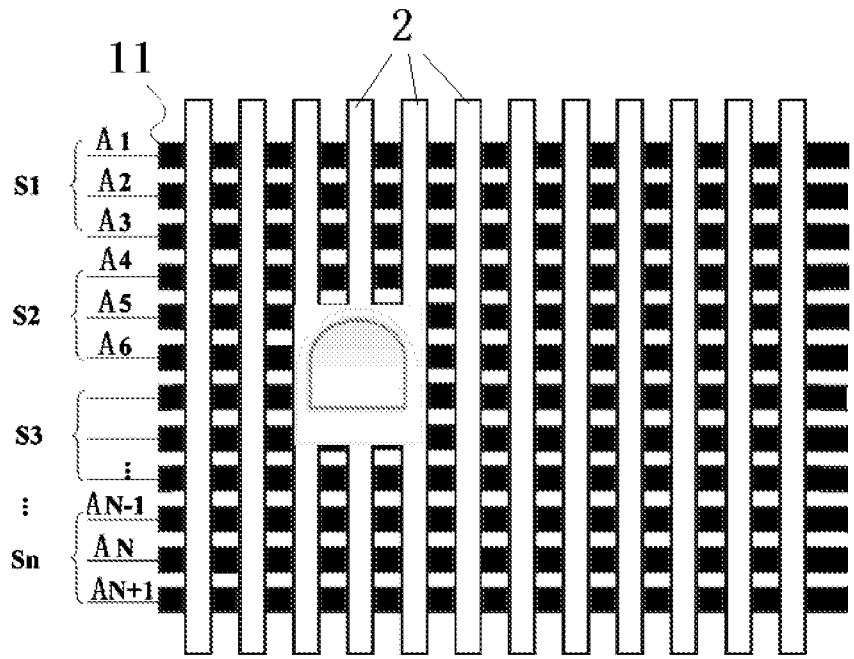
FIG. 4 is a schematic structural diagram of a touch panel according to an embodiment of the present disclosure.
Figure 5:
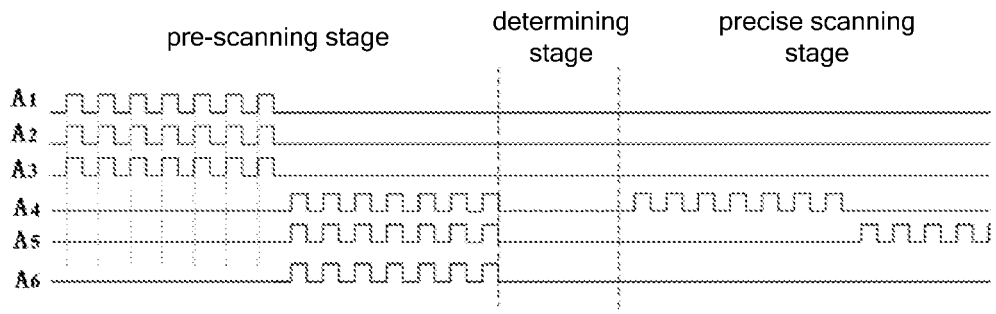
FIG. 5 illustrating a scanning sequence diagram of a touch panel according to an embodiment of the present disclosure.

Referring to the scanning sequence diagram of FIG. 5, the fingerprint recognition method for the touch panel includes following steps:

a pre-scanning step S1 of performing a pre-scanning on each of the driving electrode groups S1, S2, S3, . . . , Sn in FIG. 4 by using the scanning lines 3, scan signals applied to the driving electrodes in a same driving electrode group are the same, and a superimposed signal, which is generated by mutual capacitances between the respective driving electrodes in the driving electrode group 1 and a sensing electrode 2 being touched, is obtained from the sensing electrode 2 being touched. That is, the signal obtained from each sensing electrode 2 is a superimposed signal generated by mutual capacitances between the three driving electrodes 11 in a same driving electrode group and the sensing electrode 2. Here, the effect of the superimposed signal is to make the touch judgment more sensitive and fast. Therefore, it can be seen from FIG. 4 that, after the pre-scanning step, it is determined that the driving electrode groups S2 and S3 are touched;

a determining step S2, in which a chip (IC) determines a position of the driving electrode group being touched according to the superimposed signal obtained by the pre-scanning step, and further determines a position of a row in which the driving electrode 11 being touched is located. The chip includes a register and stores the determination result in the register. Specifically, referring to FIG. 4, in the determining step, the IC can obtain row numbers, which are A4, A5, A6, A7, A8, and A9, of the touch driving electrodes 11 being touched by a data comparison, and temporarily store the row numbers in the register, so that they can be used in a next step;

a precise scanning step S3, in which the chip sequentially scans each of the driving electrodes 11 of the driving electrode group 1 being touched according to the determination result stored in the register in the determining step to obtain a signal of a valley or a ridge of the fingerprint. Specifically, the IC accurately scans the rows A4, A5, A6, A7, A8, and A9 of driving electrodes from the row A4 according to the above-mentioned row numbers stored in the register, to obtain the signal of the valley or the ridge of the fingerprint, which is then analyzed and processed to obtain a final fingerprint image. In this process, other driving electrode groups, such as the driving electrode group S1, the driving electrode group Sn, and the like which have been determined to not being touched in the pre-scanning step S1 are not scanned, so that the scanning time can be reduced while the scanning accuracy is improved.

In this embodiment, a solution for accurately scanning each of the driving electrodes in the driving electrode group, which is determined as being touched, to determine the valleys and ridges of the fingerprint is provided; certainly, in the determining step S2 of the present embodiment, the driving electrode group being touched may be determined first, and then the driving electrodes, which are touched, of the determined driving electrode group may be further determined; sequentially, in the precise scanning step S3, the determined driving electrodes being touched may be accurately scanned to determine the valleys and ridges of the fingerprint.

An embodiment of the present disclosure provides a method for manufacturing a fingerprint recognition touch panel, including the following steps Sa, Sb, Sc and Sd.

Figure 6:
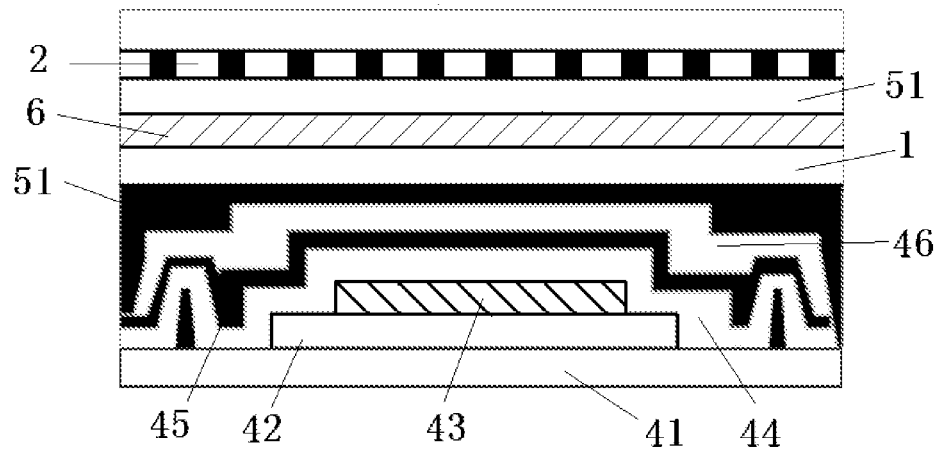
FIG. 6 is a schematic structural diagram of a touch panel during the manufacturing thereof according to an embodiment of the present disclosure.

At the step Sa, an organic light emitting device is formed; specifically, referring to FIG. 6, the step of forming the organic light emitting device specifically includes sub-steps Sa1, Sa2 and Sa3.

At the sub-step Sa1, a pixel circuit layer 42 (also referred to as an Array layer) is formed on the base substrate 41.

At the sub-step Sa2, a light-emitting layer 43 is formed on the pixel circuit layer 42.

At the sub-step Sa3, a first water blocking layer 44, a planarization layer 45, and a second water blocking layer 46 are formed on the light emitting layer 43.

At the step Sb, a plurality of driving electrode groups 1 are formed on a light emitting surface of the organic light emitting device by using a nanoimprinting method; specifically, the step of forming the plurality of driving electrode groups 1 on the light emitting surface of the organic light emitting device by using a nanoimprinting method specifically includes the following sub-steps Sb1, Sb2 and Sb3.

At the sub-step Sb 1, a UV-curable adhesive layer 51 is formed on the light emitting surface (that is, the second water-blocking layer 46) of the organic light emitting device.

Figure 7:
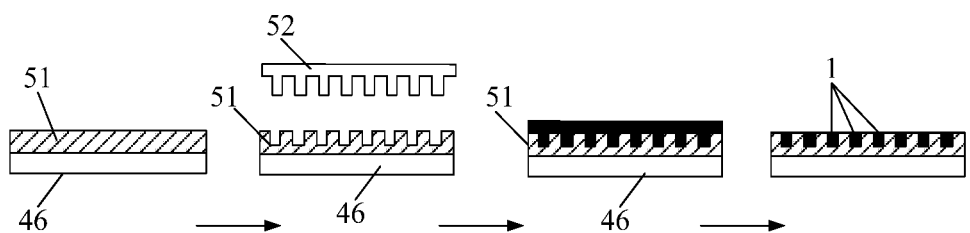
FIG. 7 is a schematic diagram illustrating steps of forming a driving electrode group in a method for manufacturing a fingerprint recognition touch panel according to an embodiment of the present disclosure.

At the sub-step Sb2, performing an imprinting on the UV-curable adhesive layer 51 by using a first master mask 52 to form a groove pattern for the driving electrode groups 1, as shown in FIG. 7.

At the sub-step Sb3, the driving electrode groups 1 are formed in the groove pattern.

In some implementations, a polishing process may be used to remove excess metal on the surfaces of the driving electrode groups 1. Specifically, a polishing process such as a mechanical polishing, a chemical electrolysis or a chemical corrosion may be employed.

In some implementations, the method for manufacturing the fingerprint recognition touch panel by using the nanoimprinting method further includes a step of synchronously forming first leads SA1, . . . , SA(N+1) corresponding to the driving electrodes 11 on the light emitting surface of the organic light emitting device by using a nanoimprinting method, as shown in FIG. 1, while forming the plurality of driving electrode groups 1 on the light emitting surface of the organic light emitting device by using the nanoimprinting method; wherein the first leads are leads for coupling the scanning lines 3 to the driving electrodes 11.

In some implementations, the sensing electrode has a width ranging from 10 nm to 1μ, and a pitch between two adjacent sensing electrodes ranges from 10 nm to 1 μm.

At the step Sc, an insulating layer 6 is formed on the driving electrode groups 1.

At the step Sd, sensing electrodes 2 are formed on the insulating layer 6 by using a nanoimprinting method, wherein the driving electrode groups 1 and the sensing electrodes 2 are disposed to intersected with each other. The sensing electrodes 2 are also formed by a nanoimprinting method, and specific steps thereof are similar to those for forming the driving electrode groups 1, and will not be described here again.

Obviously, many variations may be made on the specific implementations of the foregoing embodiments. The specific materials of the touch panel may be selected according to actual products; for example, the base substrate may be a base substrate made of a flexible material, and the specific material of the light emitting layer may be adjusted as needed. In addition, a polarizer, an encapsulation layer, or the like may be further formed above the sensing electrodes 2.

Figure 8:
FIG. 8 is a schematic structural diagram of a touch panel according to an embodiment of the present disclosure.

The present disclosure also provides a touch panel. FIG. 8 is a schematic partial structural diagram of a touch panel according to an embodiment of the present disclosure. As shown in FIGS. 1 and 2, the touch panel includes a plurality of driving electrode groups 1 and a plurality of sensing electrodes 2 which are intersected with and insulated from each other, each of the driving electrode groups 1 includes a plurality of driving electrodes 11, each of the driving electrodes 11 is coupled to a scanning line 3. In addition, as shown in FIG. 8, the touch panel 801 further includes: a first scanning device configured to perform a first scanning on each of the driving electrode groups 1 by using scanning lines 3 to detect a sensing signal generated by a sensing electrode being touched; a determining device configured to determine positions of rows in which the driving electrodes 11 in a driving electrode group 1 being touched are located according to the detected sensing signal; a second scanning device configured to sequentially perform a second scanning on the determined driving electrodes 11 being touched to obtain a valley or a ridge of a fingerprint.

The determining device first accurately scans each of the driving electrodes in the determined driving electrode group being touched to obtain the signal of the valley or the ridge of the fingerprint. Furthermore, in some implementations, the determining device then determines the driving electrodes 11 being touched from the determined driving electrode group 1, and the precise scanning performed by the second scanning device further includes: accurately scanning each of the determined driving electrodes being touched to obtain the signal of the trough or ridge of the fingerprint.

When the touch panel of the present embodiment detects a fingerprint, the first scanning device first performs touch scanning. After the touch scanning is performed for one cycle, the determining device determines the positions of the rows of the driving electrodes 11 touched by the finger, and the second scanning device performs a second scanning (that is, the precise scanning) for rows of driving electrodes 11 touched by the finger, and the valleys and ridges of the fingerprint are determined accordingly.

The sensing signal in the present embodiment is a superimposed signal obtained from mutual capacitances between the respective driving electrodes 11 in the driving electrode group 1 being touched and the sensing electrode 2. The touch panel further includes a chip (IC), and the chip includes a register. After the determining device determines the touch driving electrode 11 being touched, the chip further stores a position of a row in which the driving electrode 11 being touched is located into the register.

Further, the second scanning device performs a second scanning (the precise scanning) on the determined driving electrode 11 being touched according to information about the position stored in the register to obtain the signal of the valley or the ridge of the fingerprint, and then the signal is analyzed and processed to obtain a final fingerprint image. In this process, the driving electrode groups that have been determined to be not being touched are not scanned any more, therefore the scanning time can be reduced while the scanning accuracy is improved.

In addition, the present disclosure also provides a display device including any one of the above touch panels. The display device may be any product or component having a display function, such as an electronic paper, a mobile phone, a tablet computer, a television, a display, a notebook computer, a digital photo frame, a navigator, and the like.

It should be understood that, the foregoing embodiments are only exemplary embodiments used for explaining the principle of the present disclosure, but the present disclosure is not limited thereto. Various variations and modifications may be made by a person skilled in the art without departing from the spirit and essence of the present invention, and these variations and modifications also fall into the protection scope of the present disclosure.

The invention claimed is:

1. A capacitive fingerprint recognition method for a touch panel, wherein the touch panel comprises a plurality of driving electrode groups and a plurality of sensing electrodes which are intersected with and insulated from each other, each of the driving electrode groups comprises a plurality of driving electrodes, and each of the driving electrodes is coupled to a scanning line, the method comprises:

a first scanning step of performing a first scanning on each of the driving electrode groups by using scanning lines to detect a sensing signal generated by a sensing electrode being touched, wherein the sensing signal is a superimposed signal generated by mutual capacitances between the respective driving electrodes in the driving electrode group being touched and the sensing electrode;

a determining step of determining a driving electrode group being touched according to the detected sensing signal, determining a driving electrode being touched in the determined driving electrode group being touched, and storing the determined driving electrode being touched; and a second scanning step of sequentially performing a second scanning on the stored driving electrodes being touched to obtain a valley or a ridge of a fingerprint.

2. The capacitive fingerprint recognition method of claim 1, wherein the first scanning step further comprises:

a step of applying a same driving signal to each of driving electrodes in a same driving electrode group by the scanning lines.

3. The capacitive fingerprint recognition method of claim 1, wherein each of the driving electrode groups comprises three driving electrodes.

4. A touch panel capable of performing capacitive fingerprint recognition, comprising: a plurality of driving electrode groups and a plurality of sensing electrodes which are intersected with and insulated from each other, each of the driving electrode groups comprises a plurality of driving electrodes, each of the driving electrodes is coupled to a scanning line, and the touch panel further comprises:

a first scanning device configured to perform a first scanning on each of the driving electrode groups by using scanning lines to detect a sensing signal generated by a sensing electrode being touched, wherein the sensing signal is a superimposed signal generated by mutual capacitances between the respective driving electrodes in the driving electrode group being touched and the sensing electrode;

a determining device configured to determine a driving electrode group being touched according to the detected sensing signal, determine a driving electrode being touched in the determined driving electrode group being touched;

a storage configured to store the determined driving electrode being touched; and a second scanning device configured to perform a second scanning on the stored driving electrode in the determined driving electrode group being touched to obtain a valley or a ridge of a fingerprint.

5. A display device comprising the touch panel according to claim 4.

\* \* \* \* \*